US007053652B1

(12) United States Patent
de Jong

(10) Patent No.: US 7,053,652 B1
(45) Date of Patent: May 30, 2006

(54) STATIC MEMORY CELL CIRCUIT WITH SINGLE BIT LINE AND SET/RESET WRITE FUNCTION

(75) Inventor: Jan L. de Jong, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 55 days.

(21) Appl. No.: 10/859,839

(22) Filed: Jun. 2, 2004

(51) Int. Cl.
*H01L 25/00* (2006.01)
*H03K 19/177* (2006.01)
*H03K 3/12* (2006.01)
*H03K 3/286* (2006.01)
*H03K 3/356* (2006.01)

(52) U.S. Cl. ........................ 326/41; 327/217
(58) Field of Classification Search ............. 326/38, 326/40, 41, 44, 39; 365/49, 154, 156, 201, 365/230.06, 189.01, 203; 327/217
See application file for complete search history.

(56) References Cited

U.S. PATENT DOCUMENTS

| 4,928,266 | A | * | 5/1990 | Abbott et al. ........... 365/189.01 |
| 4,995,001 | A | * | 2/1991 | Dawson et al. ............. 365/154 |
| 5,005,068 | A | * | 4/1991 | Ikeda et al. ................ 365/154 |
| 5,053,996 | A | * | 10/1991 | Slemmer .................... 365/156 |
| 5,257,239 | A | * | 10/1993 | Guo et al. ............. 365/230.06 |
| 5,764,079 | A | * | 6/1998 | Patel et al. .................... 326/40 |
| 5,850,364 | A | * | 12/1998 | Ueno .......................... 365/203 |
| 6,101,116 | A | * | 8/2000 | Lien et al. ..................... 365/49 |
| 6,163,193 | A | * | 12/2000 | Kong .......................... 327/217 |
| 6,256,241 | B1 | * | 7/2001 | Mehalel ...................... 365/201 |
| 6,373,310 | B1 | * | 4/2002 | Jacobs ......................... 327/217 |
| 6,735,110 | B1 | * | 5/2004 | Lesea .......................... 365/154 |
| 6,756,811 | B1 | | 6/2004 | Or-Bach ....................... 326/41 |
| 6,768,338 | B1 | * | 7/2004 | Young et al. ................. 326/44 |
| 6,917,219 | B1 | * | 7/2005 | New ............................ 326/41 |
| 2004/0000927 | A1 | | 1/2004 | Dante | |
| 2005/0124095 | A1 | | 6/2005 | Liaw | |

OTHER PUBLICATIONS

P. F. Carcia et al.; "Thin Films for Phase-Shift Masks"; published in Vacuum and Thin Film, IHS Publishing Group; Sep. 14-21, 1999; pp. 1-10.
U.S. Appl. No. 10/860,234, filed Jun. 2, 2004, de Jong.

* cited by examiner

*Primary Examiner*—Patrick Wamsley
(74) *Attorney, Agent, or Firm*—Lois D. Cartier

(57) ABSTRACT

Static memory cell circuits having a single bit line further include first and second word lines, first and second cross-coupled logic gates, and first and second pass gates. The first pass gate is coupled between the bit line and a first storage node at the output of the first logic gate, and has a gate terminal coupled to the first word line. The second pass gate is coupled between the bit line and a second storage node at the output of the second logic gate, and has a gate terminal coupled to the second word line. The bit line and one of the word lines can be used to selectively set or reset a given static memory cell, if desired, without affecting other memory cells along the word line. In some embodiments, the static memory cell is a configuration memory cell of a programmable logic device (PLD).

24 Claims, 8 Drawing Sheets

STATIC MEMORY CELL CIRCUIT WITH SINGLE BIT LINE AND SET/RESET WRITE FUNCTION

FIELD OF THE INVENTION

The invention relates to memory cell circuits. More particularly, the invention relates to a static memory cell circuit that utilizes a single bit line to perform both set and reset write functions.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

FIG. 1 is a simplified illustration of an exemplary FPGA. The FPGA of FIG. 1 includes an array of configurable logic blocks (LBs 101a–101i) and programmable input/output blocks (I/Os 102a–102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. Some FPGAs also include additional logic blocks with special purposes (not shown), e.g., DLLs, RAM, and so forth.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. In many PLDs, the data bits are stored in volatile memory (e.g., static memory cells). Some PLDs include millions of these static memory cells. Therefore, it is clearly desirable to provide efficient circuit implementations that enable the reduction in size of static memory cells, to reduce the size of the overall PLD or other integrated circuit (IC) that includes the static memory cells.

One way of reducing the size of the static memory cells in an IC, as well as the size of the IC, is to use a semiconductor fabrication process that allows the use of smaller geometries in the various fabrication layers. As described in more detail below in conjunction with FIGS. 6 and 7, some fabrication processes use an imaging process known as "alternating aperture phase-shift masking". Because these processes support the reduction of geometry sizes in PLDs and other ICs, it is clearly desirable to provide methods of implementing static memory cells that comply with the requirements of phase shift masks.

SUMMARY OF THE INVENTION

The invention provides static memory cell circuits having a single bit line. According to one embodiment, a static memory cell includes a bit line, first and second word lines, first and second cross-coupled logic gates, and first and second pass gates. The first pass gate is coupled between the bit line and a first storage node at the output of the first logic gate, and has a gate terminal coupled to the first word line. The second pass gate is coupled between the bit line and a second storage node at the output of the second logic gate, and has a gate terminal coupled to the second word line. The bit line and one of the word lines can be used to selectively set or reset a given static memory cell, if desired, without affecting other memory cells along the word line. In some embodiments, the static memory cell is a configuration memory cell of a PLD, and at least one of the two storage nodes is coupled to programmable logic elements within the PLD.

The invention further provides methods of implementing a static memory cell to provide implementations that comply with the requirements of phase shift masks. According to one embodiment, a phase shift compliant memory cell is generated by implementing a bit line, first and second word lines, first and second cross-coupled logic gates, and first and second pass gates. The first and second logic gates each have output terminals coupled to first and second storage nodes, respectively. The first pass gate is coupled between the first storage node and the bit line and has a gate terminal coupled to the first word line. The second pass gate is coupled between the second storage node and the bit line and has a gate terminal coupled to the second word line.

The first and second logic gates and the first and second pass gates include transistors that use a fabrication layer (e.g., polysilicon) to implement a gate node of the transistor. All of these gate nodes extend substantially in a first direction (e.g., are generally parallel to one another, although some bending of the gate nodes is permissible). Throughout the static memory cell, the fabrication layer used to implement the gate nodes is implemented without T-shaped polygons in compliance with the requirements for a phase shift mask. In some embodiments, additional fabrication layers (e.g., active diffusion layers and/or metal layers) are also implemented in compliance with the requirements for phase shift masks.

In some embodiments, the static memory cell is a configuration memory cell for a PLD, and the method includes implementing an interconnection between at least one of the first and second storage nodes and at least one programmable logic element of the PLD.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
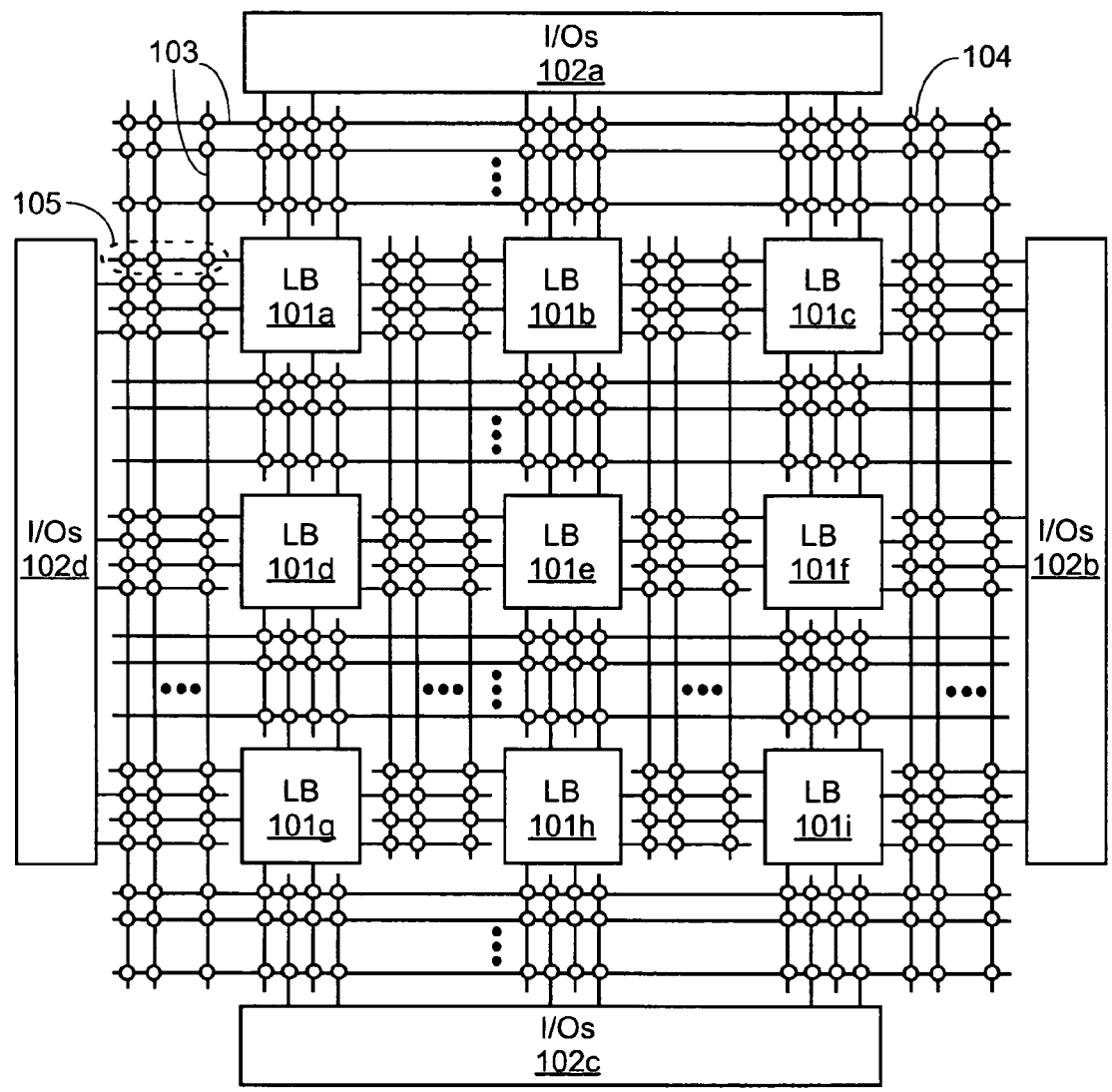
FIG. 1 is a simplified diagram of a well known Field Programmable Gate Array (FPGA) architecture.
Figure 2:
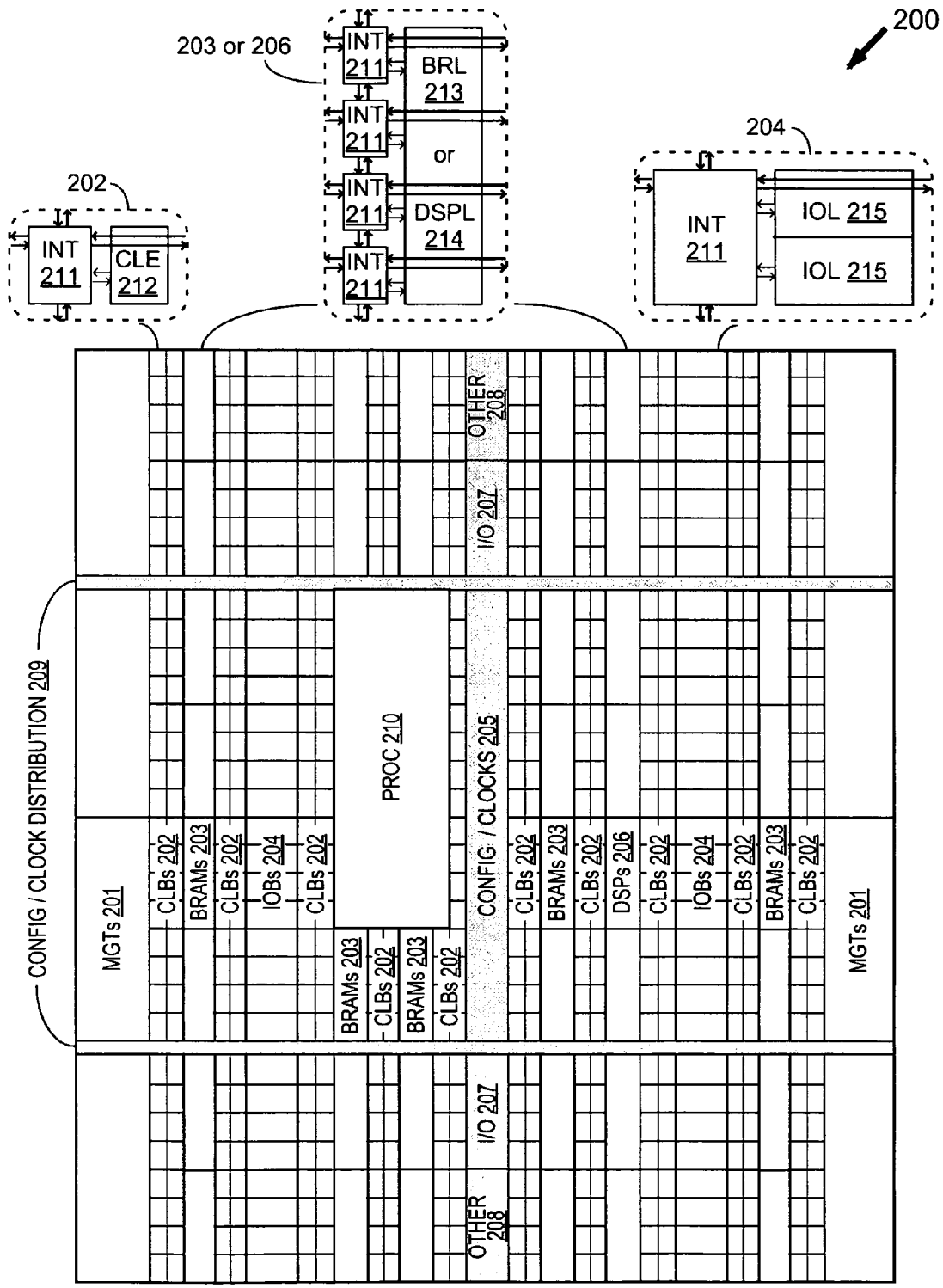
FIG. 2 is a high-level representation of another exemplary FPGA.

As noted above, advanced FPGAs can include several different types of programmable logic blocks in the array. For example, FIG. 2 illustrates an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
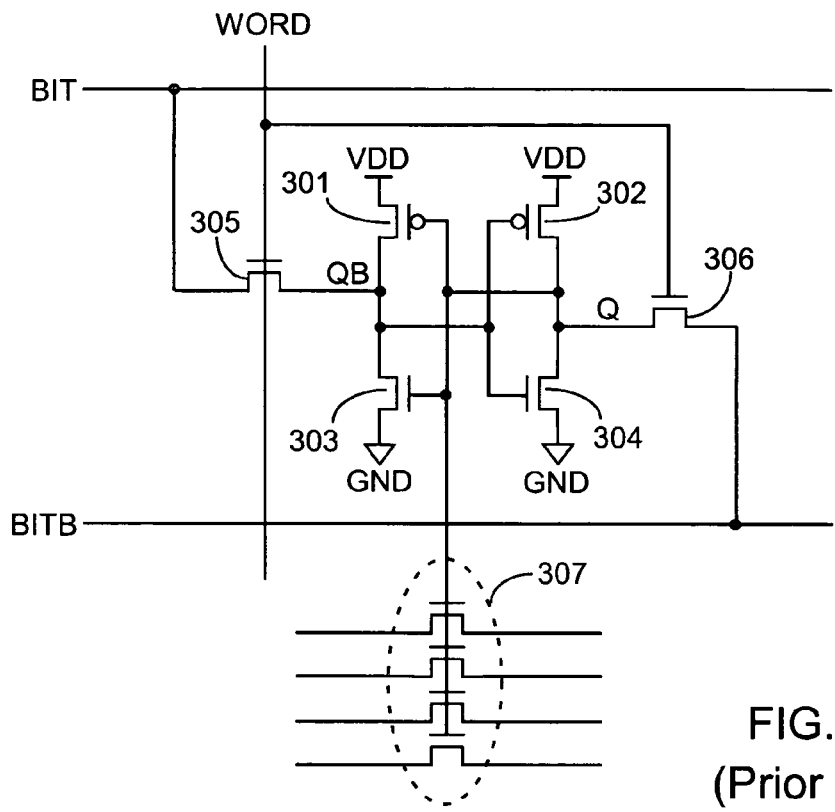
FIG. 3 is a schematic diagram illustrating a first well known configuration memory cell for a programmable logic device (PLD).

FIG. 3 illustrates a first well-known static memory cell that can be used, for example, to control the programmable elements of an FPGA. A static memory cell typically includes two cross-coupled logic gates, such as the two inverters formed by P-channel transistor 301 and N-channel transistor 303, and by P-channel transistor 302 and N-channel transistor 304. The output nodes of the two cross-coupled logic gates are referred to herein as "storage nodes". The storage node of the first inverter is node QB, and the storage node of the second inverter is node Q. In the pictured example, node Q is used to drive programmable pass gates 307, part of one or more programmable logic elements in an FPGA. Alternatively, node QB alone or both of nodes Q and QB can be used to drive one or more programmable logic elements.

An N-channel transistor 305 is coupled between node QB and a first bit line BIT, and gated by a word line WORD. Another N-channel transistor 306 is coupled between node Q and a second bit line BITB. Transistor 306 is also gated by word line WORD. Bit lines BIT and BITB are used to carry values written to the configuration memory cell, and also to read values from the configuration memory cell, e.g., during a configuration readback procedure.

To perform a write to the memory cell of FIG. 3, a true value is placed on bit line BITB and a complementary value (i.e., the inverse of the true value) is placed on bit line BIT. The word line WORD is then driven high. The value from line BIT is placed on node QB, and the value from line BITB is placed on node Q.

Note that a low value on a bit line can overwrite a high value at a storage node, but a high value on a bit line cannot overwrite a low value at the storage node. This limitation is partially due to the voltage drop inherent to N-channel transistors passing a high value, and partially due to the ratio of device sizes between the pass gate and the pulldown on the storage node. Therefore, a single memory cell can be written by providing a low value on only one of the bit lines in the memory (i.e., either BIT or BITB of a single row of memory cells), and placing a high value on only one word line (i.e., only one word line WORD is high).

To perform a read from the memory cell of FIG. 3, high values are placed on both of bit lines BIT and BITB, and word line WORD is driven high. One of the two nodes Q and QB stores a low value, and will pull the corresponding bit line down below the value on the other bit line. This difference in values can be detected, e.g., using a sense amplifier, and interpreted to derive the value stored in the memory cell.

As noted above, a PLD can include literally millions of configuration memory cells, so it is highly desirable to provide the physically smallest memory cell that can fulfill the design requirements. Further, the number of metal lines traversing a memory cell can determine the width and/or height of the cell. Note that bit lines BIT and BITB are typically implemented in metal, because they are used to write to and read from the memory cells. Word lines, on the other hand, can be implemented in polysilicon, particularly in the configuration memory cells of PLDs. In PLD configuration memory cells, the speed of the read and write processes is not as important, for example, as the speed of the read and write processes in the user-operated RAM such as block RAM. Therefore, removing a metal bit line and adding a polysilicon word line can result in an overall smaller layout without unacceptable loss of operating speed.

Figure 4:
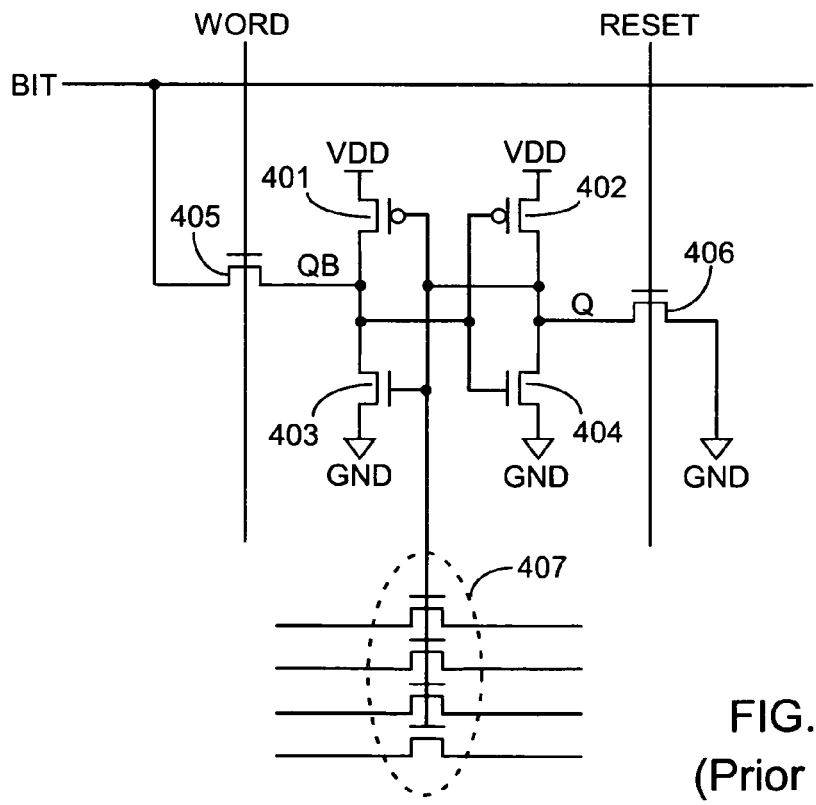
FIG. 4 is a schematic diagram illustrating a second well known PLD configuration memory cell.

The configuration memory cell of FIG. 4 provides an implementation in which the number of metal lines is reduced by removing one of the two bit lines. The configuration memory cell of FIG. 4 includes the same number of transistors as the memory cell of FIG. 3, i.e., two P-channel transistors 401–402 and four N-channel transistors 403–406. Transistors 401 and 403 form a first inverter having a storage node QB. Transistors 402 and 404 form a second inverter having a storage node Q. Storage node Q drives pass gates 407 as in the circuit of FIG. 3. Pass gate 405 couples node QB to the bit line BIT, and is gated by word line WORD. However, pass gate 406 does not couple node Q to a complementary bit line BITB. Instead, pass gate 406 couples node Q to ground GND. Pass gate 406 is driven by reset line RESET.

Note that a horizontal bit line BITB has been removed (compared to the circuit of FIG. 3), and a vertical line RESET has been added. The vertical line RESET can be implemented in polysilicon, as described above. Therefore, the total number of horizontally oriented metal lines through the cell has been reduced by one.

To write a high value to the memory cell of FIG. 4 (e.g., to place a high value on node Q and a low value on node QB), a low value is placed on bit line BIT and the word line WORD is driven high. The low value from line BIT is placed on node QB, which in turn flips the value at node Q from low to high. To write a low value to the memory cell (e.g., to place a low value on node Q and a high value on node QB), signal RESET is driven high. Note that the reset function addresses all cells along the RESET line simultaneously.

To perform a read from the memory cell of FIG. 4, bit line BIT is first pulled high and then tri-stated, and word line WORD is driven high. A low value at node QB will pull the bit line BIT down to a low value. A high value at node QB leaves the high value on bit line BIT unchanged. The read process is typically slower than the process described for the circuit of FIG. 3. However, the speed at which PLD configuration memory cells are read is not as important as in some other memory cell arrays. Therefore, this implementation is still suitable for use as a PLD configuration memory cell.

Figure 5:
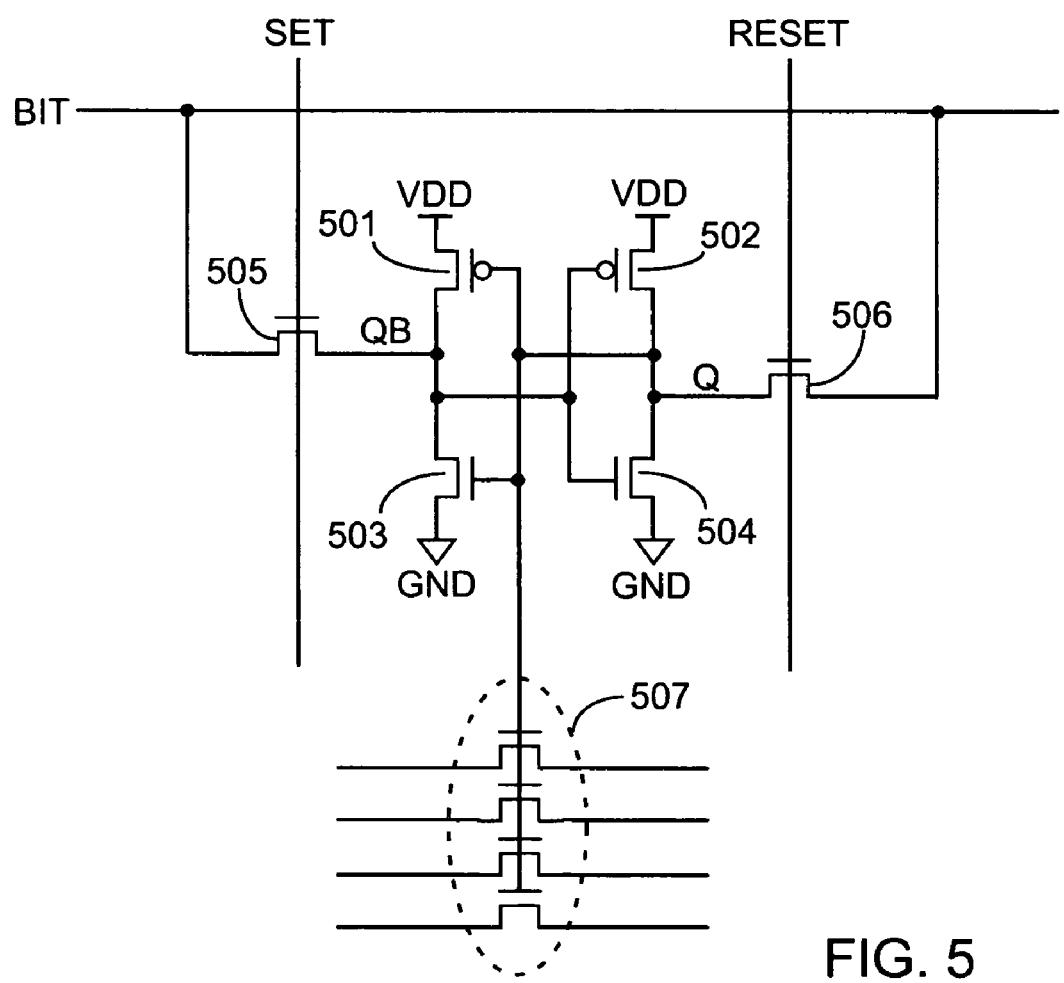
FIG. 5 is a schematic diagram illustrating a PLD configuration memory cell according to an embodiment of the present invention.

FIG. 5 illustrates a static memory cell that is similar in some respects to the circuit of FIG. 4, but provides for selectively setting or resetting a single memory cell in an array. When the static memory cell is a configuration memory cell for a PLD, the ability to selectively set or reset a single cell can be useful, for example, when performing partial reconfiguration of the PLD.

The configuration memory cell of FIG. 5 includes the same number of transistors as the memory cell of FIG. 4, i.e., two P-channel transistors 501–502 and four N-channel transistors 503–506. Transistors 501 and 503 form a first inverter having a storage node QB. Transistors 502 and 504 form a second inverter having a storage node Q. Storage node Q drives pass gates 507 as in the circuit of FIG. 4. Pass gate 505 couples node QB to the bit line BIT. However, pass gate 506 does not couple node Q to ground or to a second bit line. Instead, pass gate 506 couples node Q to the same bit line BIT coupled to pass gate 505. Pass gate 505 is driven by set line SET, and pass gate 506 is driven by reset line RESET.

To write a high value to the memory cell of FIG. 5 (e.g., to place a high value on node Q and a low value on node QB), a low value is placed on bit line BIT and the set line SET is driven high. The low value from line BIT is placed on node QB, which in turn flips the value at node Q from low to high. To write a low value to the memory cell (e.g., to place a low value on node Q and a high value on node QB), a low value is placed on bit line BIT and the reset signal RESET is driven high. The low value from line BIT is placed on node Q, which in turn flips the value at node QB from low to high.

Note that in the circuit of FIG. 5, the set and reset functions can optionally be used to directly address a specific memory cell rather than a row or a column of memory cells. When the bit line BIT is high, the cells addressed by the bit line will not change state, even if the corresponding set or reset signal is high. Therefore, to set or reset the contents of a memory cell, the bit line BIT must be low and either the set line or the reset line must be high. Hence, a specific memory cell can be addressed using one bit line and one set or reset line.

To perform a read from the memory cell of FIG. 5, bit line BIT is first pulled high and then tri-stated, and either the set line SET or the reset line RESET is driven high. When the SET line is used to perform the read operation, a low value at node QB will pull the bit line BIT down to a low value. A high value at node QB leaves the high value on bit line BIT unchanged. When the RESET line is used to perform the read operation, a low value at node Q will pull the bit line BIT down to a low value, while a high value at node Q leaves the high value on bit line BIT unchanged. Because of the additional capacitive loading on the bit line compared to the bit line of FIG. 4, the read process for the circuit of FIG. 5 can be slower than when the circuit of FIG. 4 is used.

The static memory cell of FIG. 5 is particularly well suited to use as a configuration memory cell in a PLD, because the read and write speed of these cells is not as important as, for example, the read and write speed of a user RAM array. However, the circuit of FIG. 5 is not limited to this application, and can be used in any IC that includes static memory cells.

Figure 6:
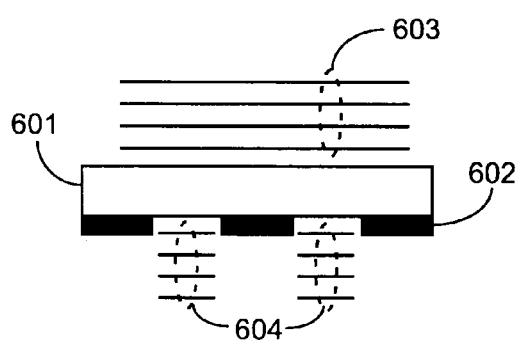
FIG. 6 illustrates the distribution of light through a traditional mask utilized in a semiconductor fabrication process.
Figure 7:
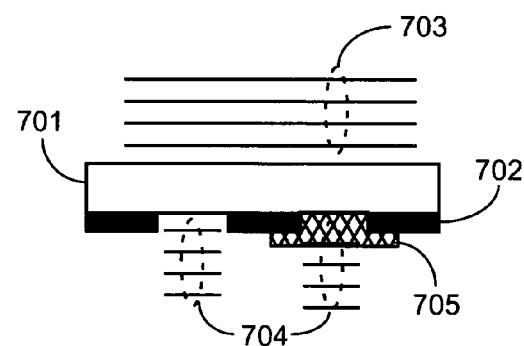
FIG. 7 illustrates the distribution of light through a phase shift mask utilized in a semiconductor fabrication process.

FIGS. 6 and 7 illustrate another consideration that can affect the layout dimensions of structures (including static memory cells) in an integrated circuit. Minimum feature sizes in semiconductor fabrication processes are typically becoming smaller with each successive process generation. In optical lithography, the minimum feature size can be limited by the wavelength of the imaging light (among other factors). This limitation can be overcome to some extent by the use of phase shift masks, as described by Carcia et al. in an article entitled "Thin Films for Phase-shift Masks", published by Vacuum and Thin Film, IHS Publishing Group, pp. 14–21, September 1999. (This article is hereby incorporated herein by reference in its entirety.)

FIG. 6 illustrates the behavior of light as it passes through a standard thin-film mask 601. The mask includes a thin film 602 defining apertures where the fabrication layer is to be laid down. The imaging light waves 603 pass through the mask 601 and are stopped by the thin film 602. The imaging light reappears through the apertures as emergent light waves 604 having the same phase as each other. Waveform 611 illustrates the amplitude of the emergent light waves 604 as they exit the apertures. Waveform 612 illustrates the amplitude of the light waves 604 as they impact the wafer (not shown), after random dispersal. Waveform 613 illustrates the intensity of the light waves 604 as they impact the wafer.

Note that the light waves from the two apertures overlap and interfere constructively (i.e., add together at least in part) at the surface of the wafer, because the light waves from the two apertures are at least partially in phase. Therefore, what was designed to be two separate features on the wafer (defined by the two apertures in mask 601) has merged into a single feature. The two apertures in mask 601 are too close together to be used in an actual fabrication process.

FIG. 7 illustrates the behavior of light as it passes through an alternating aperture phase shift mask 701. The mask 701 includes a thin film 702 defining apertures where the fabrication layer is to be laid down. In addition, covering alternating apertures is a shifter material 705 that changes the phase of the emergent light waves 704 by 180 degrees.

As in the standard mask of FIG. 6, the imaging light waves 703 pass through the mask 701 and are stopped by the thin film 702. The imaging light reappears through the apertures as emergent light waves 704. Light waves 704 from alternating apertures are shifted by the shifter material 705 and are 180 degrees out of phase from the light waves at neighboring apertures. Waveform 711 illustrates the amplitude of the emergent light waves 704 as they exit the apertures. Waveform 712 illustrates the amplitude of the light waves 704 as they impact the wafer (not shown). Waveform 713 illustrates the intensity of the light waves 704 as they impact the wafer.

Note that the light waves from the two apertures overlap and interfere destructively (i.e., cancel each other out at least in part in the overlapping areas) at the surface of the wafer. Therefore, the two features defined by the two apertures in mask 701 remain distinct, and mask 701 could be used in an actual fabrication process. The resolution of the fabrication process is significantly increased.

A phase shift mask clearly requires that, moving across the mask, areas can be created that are alternately not shifted and phase shifted by 180 degrees. For example, it is clear that a "T-shaped" polygon cannot be supported by the process, because at least one of the three areas created by the "T" must be both phase shifted and not phase shifted. Further, the features implemented by the mask must be laid out generally parallel to one another, i.e., must extend in substantially the same direction, although some bending of the features is permissible.

Figure 8:
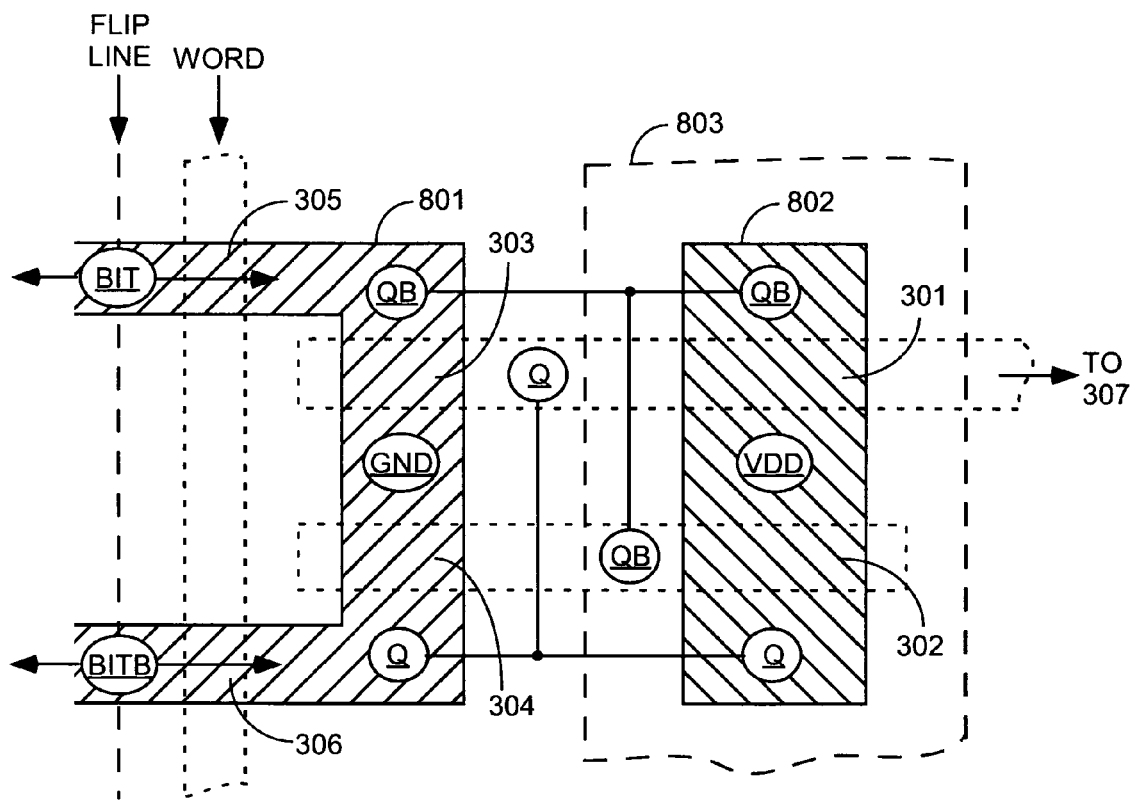
FIG. 8 is a simplified layout diagram for the configuration memory cell of FIG. 3.

FIG. 8 provides an exemplary memory cell layout in which the polysilicon layer is not suitable for implementation using a phase shift mask. FIG. 8 illustrates a typical layout for the memory cell of FIG. 3. Element 801 is an active N+ diffusion layer. Element 802 is an active P+ diffusion layer contained within an N-well 803. The areas delineated by dotted lines correspond to a polysilicon fabrication layer. As is well known, each intersection of polysilicon and diffusion implements a transistor. P-channel transistors 301 and 302 and N-channel transistors 303–306 correspond to similarly labeled transistors in FIG. 3. Labeled circular areas (Q, QB, GND, VDD, BIT, and BITB indicate contact areas between fabrication layers. The metal portions of nodes Q, QB, BIT, and BITB are drawn as simple lines, for clarity. The ground GND and power high VDD interconnections are omitted, for clarity.

Note that the gate nodes of transistors 305–306 are orthogonal to the gate nodes of transistors 301–304. Therefore, the polysilicon layer shown in FIG. 8 is not suitable for implementation in a phase shift mask.

Figure 9A:
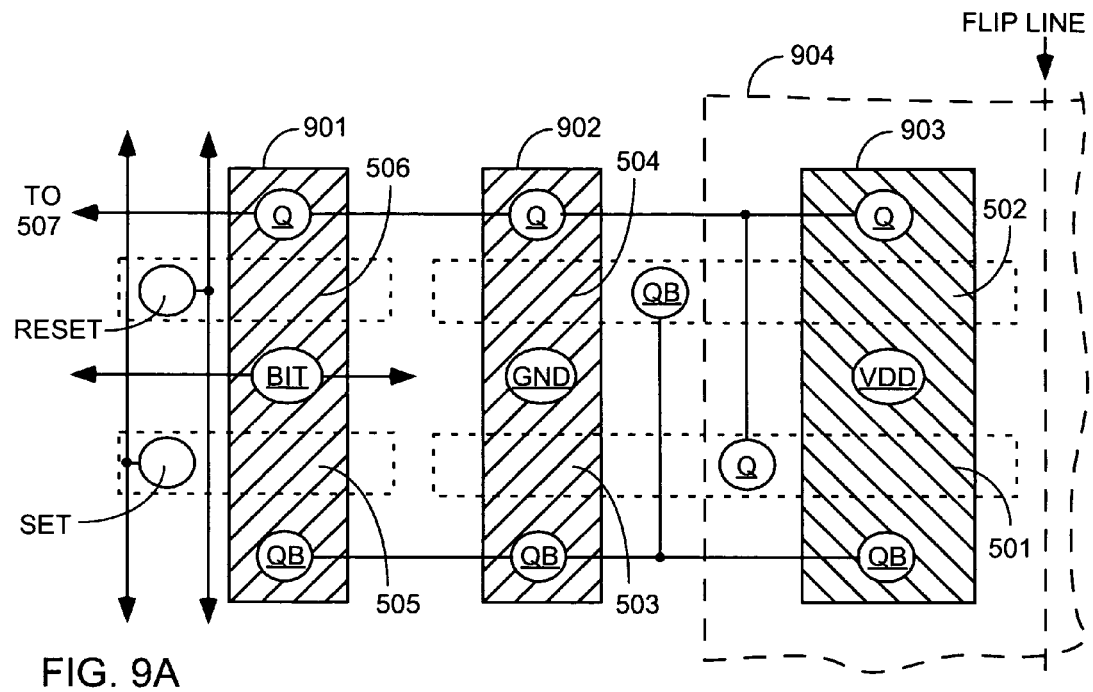
FIGS. 9A and 9B are simplified exemplary layout diagrams for the configuration memory cell of FIG. 5.
Figure 9B:
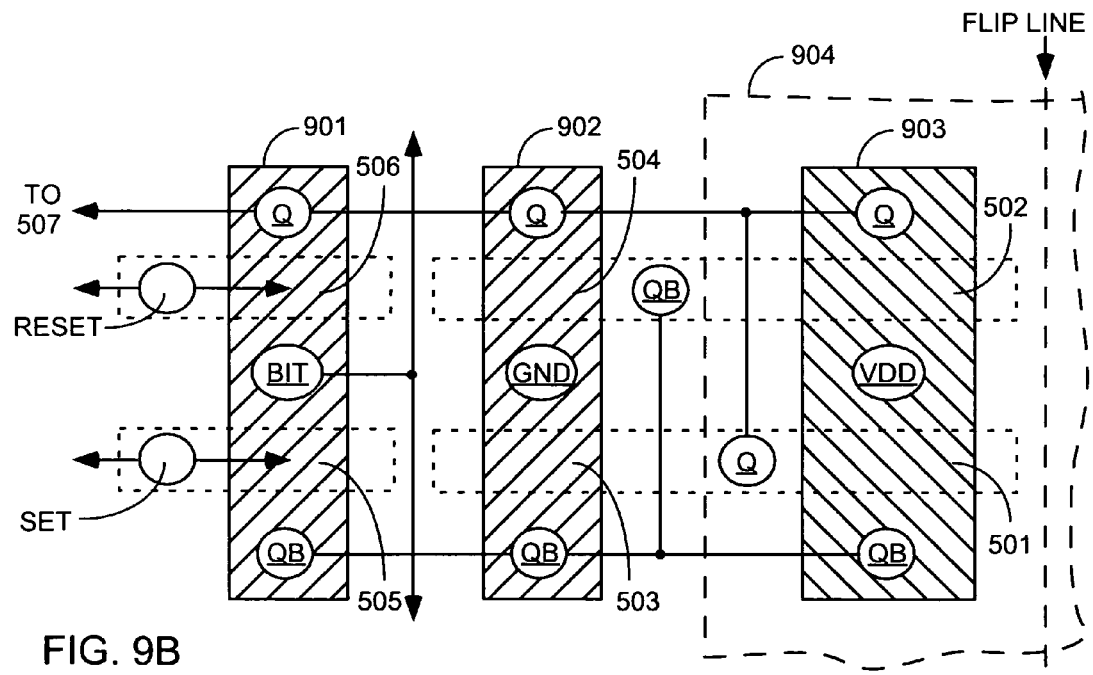

Note that FIGS. 8 and 9A–9B are not intended to describe the exact polygons that would be used to implement a memory cell, because the exact implementation depends heavily on the design rules specific to a particular semiconductor foundry and fabrication process. Given these design rules, those of skill in the art can readily produce exact layout diagrams conforming to the specified design rules. Therefore, the layout diagrams illustrated herein are simplified versions of the actual layouts, provided to illustrate certain features of the memory cells described herein.

For example, referring to FIG. 8, note that the word line WORD runs vertically through the memory cell in polysilicon, near the flip line for the cell. The output of the cell, node Q, exits in polysilicon to the destination pass transistors 307 from the right side of the figure, on the side opposite the flip line. The BIT and BITB lines (indicated as arrows) run in one of the metal layers in a horizontal direction, orthogonal to the vertically oriented word line WORD.

The memory cell circuit of FIG. 4 is similar to that of FIG. 3, except that the bit line BITB is replaced by a ground line GND. Therefore, the memory cell circuit of FIG. 4 can be laid out, for example, in a similar fashion to that shown in FIG. 8, with the connection to BITB replaced by a connection to ground.

FIGS. 9A and 9B provide exemplary memory cell layouts in which the polysilicon layer is suitable for implementation using a phase shift mask. FIGS. 9A and 9B correspond to the memory cell of FIG. 5. Elements 901 and 902 are active N+ diffusion layers. Element 903 is an active P+ diffusion layer contained within an N-well 904. The areas delineated by dotted lines correspond to a polysilicon fabrication layer. P-channel transistors 501 and 502 and N-channel transistors 503–506 correspond to similarly labeled transistors in FIG. 5. Labeled circular areas (Q, QB, GND, VDD, BIT, SET, and RESET) indicate contact areas between fabrication layers. The metal portions of nodes Q, QB, BIT, SET, and RESET are drawn as simple lines, for clarity. The ground GND and power high VDD interconnections are omitted, for clarity.

Note that in both figures, the gate nodes of transistors 505–506 extend in the same direction as the gate nodes of transistors 501–504. Further, the polysilicon layer in FIGS. 9A and 9B is implemented without T-shaped polygons. Therefore, the polysilicon layer shown in FIGS. 9A and 9B complies with the requirements for a phase shift mask. In some embodiments, other fabrication layers in addition to the polysilicon layer are implemented without T-shaped polygons. For example, in the embodiment of FIG. 9A the active diffusion layer is also phase-shift compliant. In some embodiments, the vertical metal lines are implemented in one metal layer, and the horizontal metal lines are implemented in another metal layer, and both vertical and horizontal metal lines are phase shift compliant.

In FIG. 9A, the bit line BIT extends in the same direction as the gate nodes of the transistors, and the word lines SET and RESET are orthogonal to the gate nodes. In FIG. 9B, the bit line BIT is orthogonal to the gate nodes, and the word lines SET and RESET extend in the same direction as the gate nodes.

Figure 10:
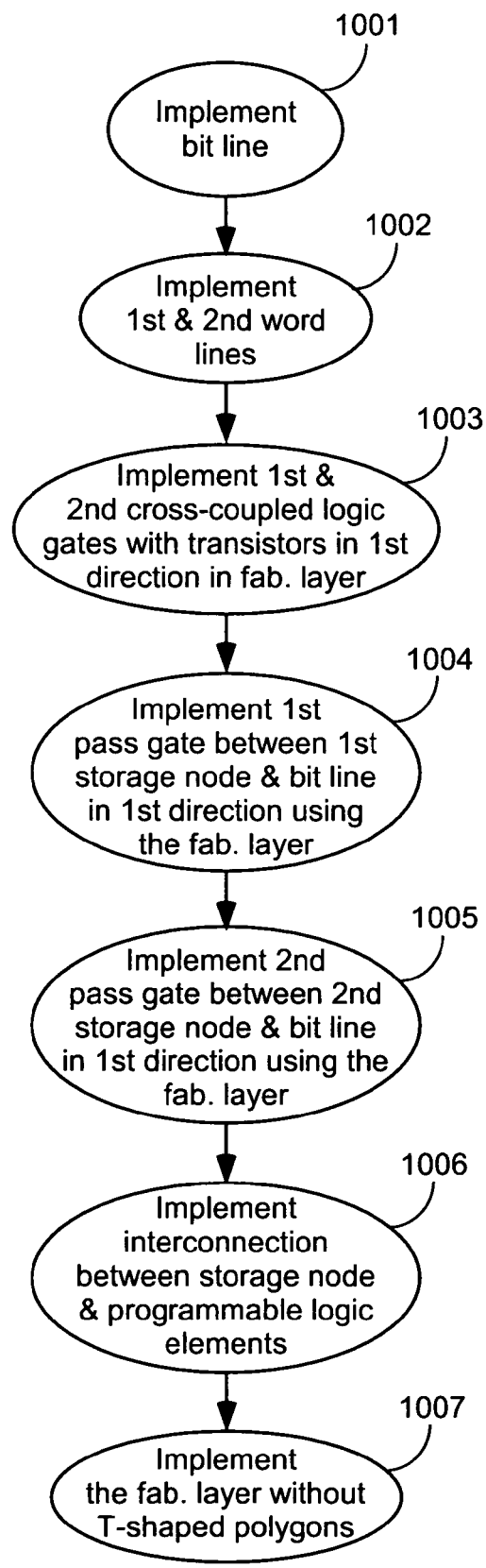
FIG. 10 illustrates the steps of a method of implementing a configuration memory cell in a PLD.

FIG. 10 illustrates the steps of a method of implementing (e.g., designing, laying out, or fabricating) a configuration memory cell in a PLD. This method can be applied, for example, to the memory cell circuit illustrated in FIG. 5. However, the method is not limited thereto. In some embodiments, the method is applied to a PLD that includes programmable logic elements.

In step 1001, a bit line is implemented, e.g., utilizing a first metal layer. Note that the nomenclature "first", "second", and so forth as used herein is not intended to imply that the designated elements are designed, laid out, or fabricated in any particular order. Further, the steps of the methods shown in FIGS. 10–12 are not necessary performed in the order shown. For example, the layout process typically involves entering and altering polygons representing many different layers as part of an interactive process. Further, the fabrication process typically does not occur in the illustrated order. For example, metal layers (e.g., bit lines) are typically added after polysilicon layers (e.g., gate nodes).

In step 1002, first and second word lines are implemented, e.g., utilizing a second metal layer.

In step 1003, first and second cross-coupled logic gates (e.g., inverters) are implemented. Each of the first and second logic gates has a storage node (a first and second storage node, respectively) coupled to an output terminal of the logic gate. Each logic gate includes at least two transistors, and each transistor includes a fabrication layer or "fab. layer" (e.g., polysilicon) that implements the gate of the transistor, with the gate node extending substantially in a first direction.

In step 1004, a first pass gate is implemented between the first storage node and the bit line implemented in step 1001. The first pass gate has a gate terminal coupled to the first word line, and utilizes the fabrication layer to implement a gate node thereof that also extends substantially in the first direction.

In step 1005, a second pass gate is implemented between the second storage node and the bit line implemented in step 1001. The second pass gate has a gate terminal coupled to the second word line, and utilizes the fabrication layer to implement a gate node thereof that also extends substantially in the first direction.

In step 1006, an interconnection is implemented between at least one of the first and second storage nodes of the configuration memory cell and at least one programmable logic element in the PLD.

In step 1007, which can occur simultaneously and/or interactively at least with steps 1003–1005, the fabrication layer is laid out throughout the configuration memory cell without any T-shaped polygons, in compliance with the requirements for a phase shift mask.

The method illustrated in FIG. 10 (with the exception of step 1006) can also be applied to ICs other than PLDs, and to a static memory cell other than a configuration memory cell in a PLD or in any other IC.

In some embodiments (e.g., embodiments utilizing current silicon-based fabrication processes), the fabrication layer used to implement the gate nodes is a polysilicon layer. However, other fabrication processes may exist or may be developed in which the fabrication layer comprises some other material, and embodiments utilizing these materials are also encompassed by the present invention.

In some embodiments, the bit line extends substantially in the first direction, i.e., the bit line is traverses the memory cell in a direction generally parallel to the gate nodes, although some bending is permissible. In some embodiments, the word lines extend substantially in a second direction orthogonal to the first direction. In some embodiments, the bit line extends substantially in the second direction.

Those having skill in the relevant arts of the invention will now perceive various modifications and additions that can be made as a result of the disclosure herein. For example, the above text describes the circuits and methods of the invention in the context of programmable logic devices (PLDs) such as FPGAs and CPLDs. However, the circuits and methods of the invention can also be implemented in other integrated circuits utilizing static memory cells, including non-programmable circuits.

Further, transistors, P-channel transistors, N-channel transistors, logic gates, inverters, pass gates, memory cells, static memory cells, configuration memory cells, and other components other than those described herein can be used to implement the various aspects of the present invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A configuration memory cell for a programmable logic device (PLD) comprising programmable logic elements, the configuration memory cell comprising:
    a bit line;
    first and second word lines;
    first and second cross-coupled logic gates having output terminals coupled to first and second storage nodes, respectively;
    a first pass gate coupled between the first storage node and the bit line and having a gate terminal coupled to the first word line; and a second pass gate coupled between the second storage node and the bit line and having a gate terminal coupled to the second word line, wherein at least one of the first and second storage nodes is coupled to at least one of the programmable logic elements.

2. The configuration memory cell of claim 1, wherein the first and second logic gates and the first and second pass gates each comprise a plurality of transistors, and wherein all of the plurality of transistors are laid out in a fashion compliant with the requirements for a phase shift mask.

3. The configuration memory cell of claim 2, wherein all of the plurality of transistors are laid out parallel to one another.

4. The configuration memory cell of claim 1, wherein the first and second logic gates comprise first and second inverters.

5. The configuration memory cell of claim 1, wherein the first and second pass gates comprise N-channel transistors.

6. The configuration memory cell of claim 1, wherein the programmable logic elements comprise third pass gates, and the at least one of the first and second storage nodes is coupled to gate terminals of the third pass gates.

7. A programmable logic device (PLD) comprising a plurality of programmable logic elements and a plurality of configuration memory cells, each configuration memory cell comprising:
a bit line;
first and second word lines;
first and second cross-coupled logic gates having output terminals coupled to first and second storage nodes, respectively;
a first pass gate coupled between the first storage node and the bit line and having a gate terminal coupled to the first word line; and
a second pass gate coupled between the second storage node and the bit line and having a gate terminal coupled to the second word line,
wherein for each configuration memory cell at least one of the first and second storage nodes is coupled to at least one of the programmable logic elements.

8. The PLD of claim 7, wherein the first and second logic gates and the first and second pass gates each comprise a plurality of transistors, and wherein all of the plurality of transistors are laid out in a fashion compliant with the requirements for a phase shift mask.

9. The PLD of claim 8, wherein all of the plurality of transistors are laid out parallel to one another.

10. The PLD of claim 7, wherein for each configuration memory cell the first and second logic gates comprise first and second inverters.

11. The PLD of claim 7, wherein for each configuration memory cell the first and second pass gates comprise N-channel transistors.

12. The PLD of claim 7, wherein the programmable logic elements comprise third pass gates, and for each configuration memory cell the at least one of the first and second storage nodes is coupled to gate terminals of at least one of the third pass gates.

13. The PLD of claim 7, wherein the PLD comprises a field programmable gate array (FPGA).

14. A static memory cell, comprising:
a bit line;
first and second word lines;
first and second cross-coupled logic gates having output terminals coupled to first and second storage nodes, respectively;
a first pass gate coupled between the first storage node and the bit line and having a gate terminal coupled to the first word line; and
a second pass gate coupled between the second storage node and the bit line and having a gate terminal coupled to the second word line, and
wherein the first and second logic gates and the first and second pass gates each comprise a plurality of transistors, and wherein all of the plurality of transistors are laid out in a fashion compliant with the requirements for a phase shift mask.

15. The static memory cell of claim 14, wherein the first and second logic gates comprise first and second inverters.

16. The static memory cell of claim 14, wherein the first and second pass gates comprise N-channel transistors.

17. The static memory cell of claim 14, wherein all of the plurality of transistors are laid out parallel to one another.

18. The static memory cell of claim 14, wherein the static memory cell comprises a configuration memory cell for a programmable logic device (PLD).

19. An integrated circuit (IC) comprising a plurality of static memory cells, each static memory cell comprising:
a bit line;
first and second word lines;
first and second cross-coupled logic gates having output terminals coupled to first and second storage nodes, respectively;
a first pass gate coupled between the first storage node and the bit line and having a gate terminal coupled to the first word line; and
a second pass gate coupled between the second storage node and the bit line and having a gate terminal coupled to the second word line, and
wherein the first and second logic gates and the first and second pass gates each comprise a plurality of transistors and wherein all of the plurality of transistors are laid out in a fashion compliant with the requirements for a phase shift mask.

20. The IC of claim 19, wherein the IC comprises a programmable logic device (PLD).

21. The IC of claim 20, wherein the PLD comprises a field programmable gate array (FPGA).

22. The IC of claim 19, wherein the first and second logic gates comprise first and second inverters.

23. The IC of claim 19, wherein the first and second pass gates comprise N-channel transistors.

24. The IC of claim 19, wherein all of the plurality of transistors are laid out parallel to one another.

* * * * *